(12) United States Patent
Vienot et al.

(10) Patent No.: US 9,521,793 B2
(45) Date of Patent: Dec. 13, 2016

(54) METHOD AND DEVICE FOR FILLING CARRIER TAPES WITH ELECTRONIC COMPONENTS

(75) Inventors: Sylvain Vienot, Villers-le-Lac (FR); Franco Craveiro, Hauterive (CH); Philippe Roy, Gilley (FR)

(73) Assignee: ISMECA SEMICONDUCTOR HOLDINGS SA, La Chaux-de-Fonds (CH)

(*) Notice: Subject to any disclaimer, the term of this patent is extended or adjusted under 35 U.S.C. 154(b) by 463 days.

(21) Appl. No.: 13/152,509

(22) Filed: Jun. 3, 2011

(65) Prior Publication Data

US 2011/0231002 A1    Sep. 22, 2011

Related U.S. Application Data

(63) Continuation of application No. PCT/EP2010/051179, filed on Feb. 1, 2010.

(30) Foreign Application Priority Data

Feb. 3, 2009 (EP) .................................. 09151921

(51) Int. Cl.
*G06F 19/00* (2011.01)
*H05K 13/02* (2006.01)

(52) U.S. Cl.
CPC .................... *H05K 13/021* (2013.01)

(58) Field of Classification Search
CPC .............................................. G06F 19/00
USPC .............................. 700/110, 11; 29/832, 740
See application file for complete search history.

(56) References Cited

U.S. PATENT DOCUMENTS

| | | | |
|---|---|---|---|
| 4,687,152 A * | 8/1987 | Hawkswell | H05K 13/0417 156/750 |
| 5,974,903 A | 11/1999 | Shirley et al. | |
| 6,634,159 B1 | 10/2003 | Muto et al. | |
| 2002/0133940 A1* | 9/2002 | Kadomatsu et al. | 29/832 |
| 2003/0024216 A1* | 2/2003 | Behnke et al. | 53/473 |

FOREIGN PATENT DOCUMENTS

| | | |
|---|---|---|
| DE | 102005041024 | 3/2007 |
| EP | 1073325 A2 * | 1/2001 |
| EP | 1073325 A3 | 4/2002 |
| JP | 2001018911 A | 2/2001 |

(Continued)

OTHER PUBLICATIONS

International Search Report for PCT/EP2010/051179 dated Jul. 5, 2010.

*Primary Examiner* — Tejal Gami
(74) *Attorney, Agent, or Firm* — Maschoff Brennan

(57) ABSTRACT

A method for filling a carrier tape (10) with electronic components (12) and for removing and replacing defective electronic components (13) from the carrier tape, comprising the steps of:
- at a filling station (1), loading an electronic component in a pocket (11) of the carrier tape (10),
- moving said carrier tape (10) forward,
- automatically detecting that said electronic component which is defective,
- moving said carrier tape backward, and unloading the defective electronic component (13) from the carrier tape (10),
- at said filling station (1), filling said packet with a new electronic component.

18 Claims, 4 Drawing Sheets

(56) References Cited

FOREIGN PATENT DOCUMENTS

| JP | 2004090955 A | 3/2004 |
|---|---|---|
| WO | 99/03733 | 1/1999 |
| WO | 2004/052069 A1 | 6/2004 |

* cited by examiner

METHOD AND DEVICE FOR FILLING CARRIER TAPES WITH ELECTRONIC COMPONENTS

CROSS-REFERENCE TO RELATED APPLICATIONS

The contents of European Application No. EP09151921, filed Feb. 3, 2009, and International PCT application No. PCT/EP2010/051179 is hereby incorporated by reference.

FIELD OF THE INVENTION

The present invention concerns a method for filling carrier tapes with electronic components, and a corresponding device.

DESCRIPTION OF RELATED ART

During their manufacture, their conditioning or before being integrated into a printed circuit, electronic components, for example semiconductor chips, generally undergo a series of operations such as electric tests, during which they are tested and otherwise processed on a test and production line that is often entirely automated. The electronic components are thus transferred from one processing station to another by a conveyor, which can be for example linear or circular.

Circular conveyors, such as turrets, are designed for transporting components of small size, and particularly electronic components, between a plurality of processing stations placed at the periphery of the revolving turret. These turrets are often used for testing and conditioning electronic components, as mentioned above. An example of test line comprising one turret and a plurality of processing stations is disclosed in WO2004/052069.

With reference to FIG. 1, a circular turret 1 can take a plurality of indexed positions. Several regularly spaced locations of processing stations 2 are defined around the turret, each of which is generally occupied by a processing station performing one or several operations on the electric components presented to it. In certain cases, a processing station can occupy several locations. All the processing stations placed around the barrel thus perform a cycle of successive operations, such as visual, mechanical and electric tests, that the component conveyed on the turret undergo. The turret 1 is equipped with component holders serving to remove or receive the components from the different processing stations, to hold them during the turret's movement and, if necessary, to present them to the following processing station.

In most cases, the component-holders comprise a pick-up nozzle taking and holding the electronic components through air-vacuum.

The different processing stations, including the tape filling station, are advantageously fastened in a modular fashion around the turret 1. The position of each processing station relative to the turret 1 is precisely determined.

The processed electronic components which were for example tested by the automatic processing line are deposited by the turret 1 onto an output station. Components rejected during the tests are usually deposited onto another output station or into a tray.

It is a common practice in automation of electronic products, to have electronic components packaged on a flexible tape support with longitudinally spaced pockets that correspond to the sizes and the shapes of the electronic components. Packaging tapes can have indefinite length and may be conveniently coiled in reels for compact storage, protection, and interoperation with automatic machinery. Some testing and processing lines are thus equipped with an output station that drops the electronic components having passed all the tests on the different processing stations into the pockets of a tape.

It is often desirable to inspect the electronic components after their insertion in the tape. This allows for example detection of defective components, such as components which do not work properly, which have not been marked correctly, or which are misaligned, tilted or turned over in the pockets, or components having other defects undetected by the other processing stations. A removing device may then be used for picking defective components out from the tape, and producing a carrier tape that contains only defect-free components.

However, this selective removal of defective components produces a tape having gaps, i.e., empty pockets from which components have been removed. This is often undesirable, since the number of components in such a carrier tape becomes difficult to be recorded, and since it makes automatic processing of the tape by another machine, for example by a pick-and-place device, much more difficult.

U.S. Pat. No. 5,974,903 describes a method and an apparatus for visual inspection of integrated circuits contained within a carrier tape. In this device, defective integrated circuits are manually replaced by an operator. This is an expensive, slow and tedious solution, which introduces a quality risk due to the human intervention.

EP1073325 describes a system for testing semiconductor chips in which an additional pick-and-place tool is used for removing the chips which are found to be bad, and for replacing them with good chips. Operation of this pick-and-place tool is not described, but the document indicates that an additional cassette loaded with good chips could be used as a source of replacement chip. This solution thus requires an additional source of chips and an additional placing tool for replacing the defective chips removed from the tape.

WO9903733 discloses a drive for a carrier tape used in conjunction with a pick and place module of a machine for inspecting. The drive advances the carrier tape to its desired position in two steps. The proper positioning of a component in a compartment is inspected. If the electronic component is defective, the carrier tape is moved backward, the component is unloaded from the carrier tape, and the pocket is filled with a new component.

In this last solution, a defective component is unloaded from and a new component is loaded into the same pocket at the same position. This is only possible if the same device is used for loading and unloading a component. Operating such a common device for the two functions (unloading the defective component and loading a new one) is necessarily slow, and not possible on turret-based machines.

Operating two different devices for unloading a defective component and for loading a replacement component into the same pocket at the same position is usually not possible either, since the size of the pockets for modern and tiny electronic components is too small. In this case, the filling and unloading systems are too large and it is not possible to center both devices above a single pocket.

Other devices for filling a tape with components are described in JP2004090955, in JP2001018911 and in U.S. Pat. No. 6,634,159.

It is an aim of the invention to propose a new method and a new device for removing and replacing defective components from a tape and for delivering a defect-free tape with no gaps.

BRIEF SUMMARY OF THE INVENTION

According to the invention, these aims are achieved by means of a method for filling a carrier tape with electronic components and for removing and replacing defective electronic components from the carrier tape, wherein said electronic components are transported between a plurality of processing stations and said filling station by a turret, comprising the steps of:

at a filling station, loading a component in a pocket of said carrier tape, moving said carrier tape forward, automatically detecting that said component is defective, when a defective component has been detected, rotating said turret in a first direction, moving said carrier tape backward, unloading the defective electronic component from the carrier tape, rotating said turret in a second direction opposite to said first direction, and filling at said filling station said pocket with a new electronic component.

The rotation of the turret in a first direction and the displacement of the tape backward can be made in any order, or simultaneously.

This method has the advantage of being compatible with state-of-the-art, fast turret based machine for testing and handling components.

This method also has the advantage of using the same filling station for loading the initial electronic component and the replacement component into a pocket. Furthermore, the same source of components is used for initially filling the pockets of the carrier tape and for replacing defective components.

The rotation of the turret in a first direction allows presenting an unloading device above the pocket at the filling station. The rotation in the reverse direction after unloading of the defective component allows replacing this unloading system by the loading system used for inserting a replacement component.

Since the turret is moved backward and forward during the replacement, it is possible to center above the pocket an unloading system in a first step, and a loading system in a second step. Thus, two different systems are used at the same filling and unloading station.

A defective electronic component, in this application, means any component which does not perform correctly, a component which was not marked correctly, a component with bent or other defective pads or leads, or a component which has not been inserted or aligned correctly into the pocket of the carrier tape, for example a component which is turned, flipped or tilted in the pocket (even if this component would work properly).

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
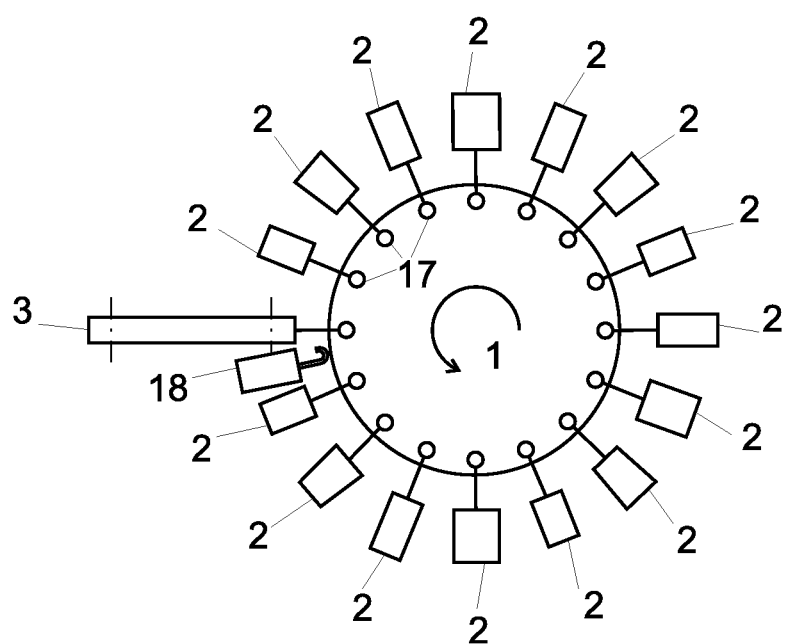
FIG. 1 shows a top view of a system for testing electronic components, comprising a turret and an output device for loading tested components into a carrier tape.

FIG. 1 shows a top view of a system for testing electronic components, comprising a turret 1 with a plurality of working stations 2 of various type and size arranged around the turret.

The turret 1 is equipped on its periphery with a plurality of component-holders 17, for example suction nozzles, allowing electronic components to be held by vacuum and transported from one working station 2 to the next of the processing line. The successive working stations perform various successive operations on the electronic components, such as tests, marking, conditioning, sorting and other operations.

Components to be tested are fed to the turret by a feeding station (which may be any of the working station 2). After the series of tests and manipulations, defect-free components are unloaded from the turret, and filling into pockets of a carrier tape at a tape filling station 3. The reference number 18 designates a vacuum system for removing defective components from the carrier tape, as will be explained later.

FIGS. 2 to 10 are side view of the tape filling station that loads electronic components into a carrier tape. Successive steps of the process are shown on the successive Figures.

Figure 2:
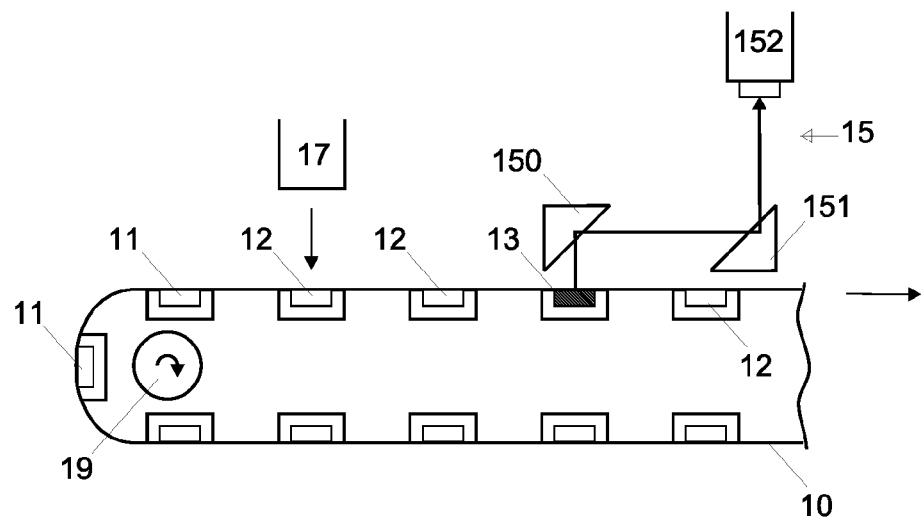
FIG. 2-10 show successive side views of a device for filling a carrier tape with electronic components and for removing and replacing defective electronic components from the carrier tape.

The system shown on FIG. 2 comprises a carrier tape 10 with a plurality of regularly spaced pockets 11 for lodging electronic components 12 after the test on the turret. The electronic components are dropped into the tape 10 when the vacuum of a component holder 17 of the turret 1 is released, so that the electronic component 12 held by this holder by gravity into the pocket 11 of the carrier tape 10 below the nozzle. Other devices from filling a carrier tape with electronic components from the turret may be used within the frame of the invention.

The carrier tape 10 is continuously moved forward in the direction of the arrow by a roller 19. Electronic component 12 dropped at the filling station thus reach an inspection position where they are inspected by an inspection system 15. The tape is advanced even if the electronic component was loaded abnormally, in order to permit inspection at a different place. In the illustrated example, the inspection system 15 inspects the component which is 12 millimeters ahead of the filling station; depending on the pitch between the pockets of the tape, this may correspond to the component two, three or four pitches ahead of the filling station. The inspection system may be a vision system comprising a camera 152 as well as prisms 150, 151 or mirrors for redirecting the image of the component toward the camera. Other inspection systems may be used within the frame of the invention. The inspection system 15 allows an automatic verification of the components, and automatic detection of defective components 13, for example components which are mismarked, misaligned, flipped, tilted or deviated. Other tests and inspections may be performed on the components 12, 13 within the pockets.

In another, not illustrated embodiment, the system comprises a plurality of inspection station along the tape. For example, in one embodiment, the system comprises a first, mechanical inspection system, and a second, optical inspection system. The mechanical inspection system may comprise a rotating cover or flag just above the tape, arranged so as to be displaced each time a component tilted or turned protrudes out of the pocket. This displacement is detected for example by an inductive sensor, or by any suitable sensor. A spring brings the cover back to its initial position after it has been moved. In one embodiment, the mechanical inspection system is arranged a few 1/10 millimeters ahead of the filling station (which does not necessarily correspond to an integer number of pitches), while the optical monitoring system is placed after the mechanical system, for example 12 millimeters ahead of the filling station.

Reference number 13 in FIG. 2 designates a defective component. Detection of this defective component by the optical and/or mechanical inspection system triggers automatic inversion of the direction of the carrier tape 10, until the defective component 13 is reverted back to the filling station below the vacuum nozzle 17, as illustrated on FIG. 3. The distance of displacement corresponds to the distance between the inspection station that detected the defective component and the filling station.

Figure 4:
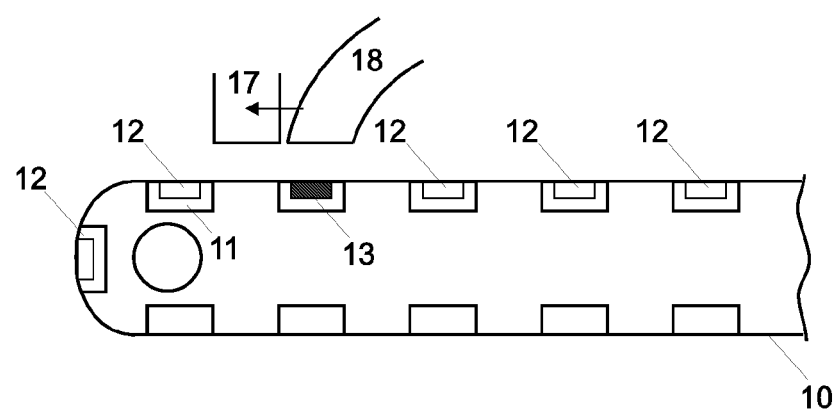
Figure 5:
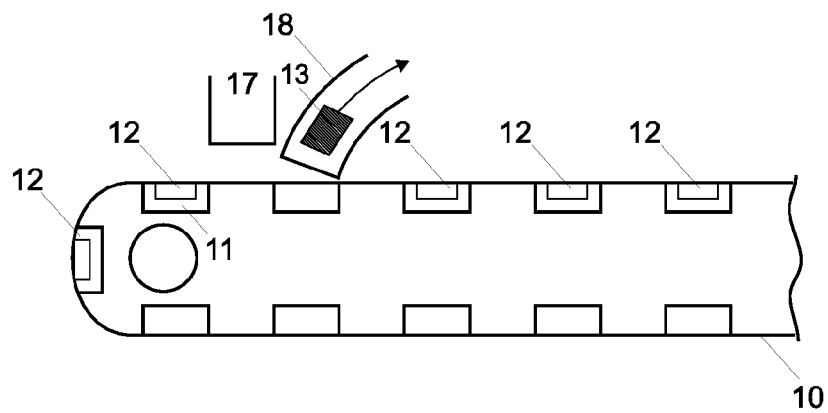

On FIG. 4, the turret 1 is indexed by half a step onward, and thus enables a vacuum system 18 to get free access to the pocket of the carrier tape 10 that contains the defective component 13. The defective component 13 is then removed out of the pocket, using the vacuum system 18 (FIG. 5) that sucks it into a tray (not shown) for defective components. Other systems may be used for removing defective components from pockets. Alternatively, the position of the component may be corrected, using for example a vibratory system. Defective components which are working properly, but only misaligned or flipped in a pocket, can of course be reused and loaded into a different carrier tape.

Figure 3:
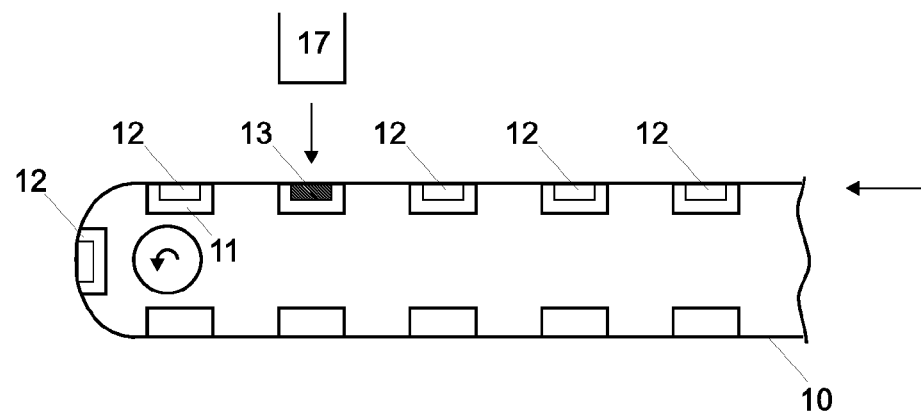
Figure 6:
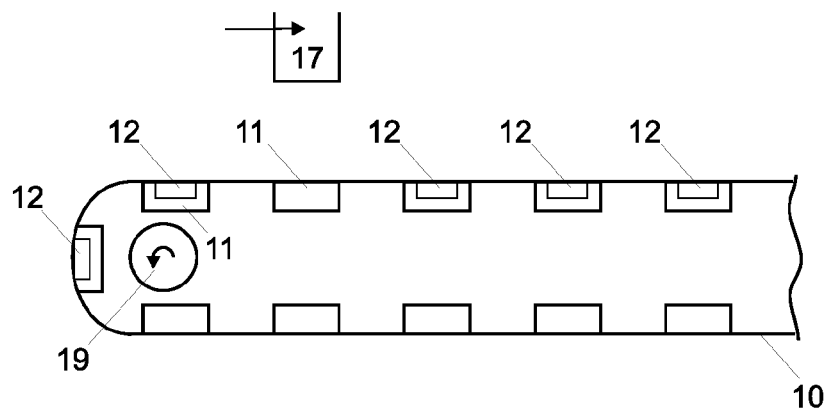
Figure 7:
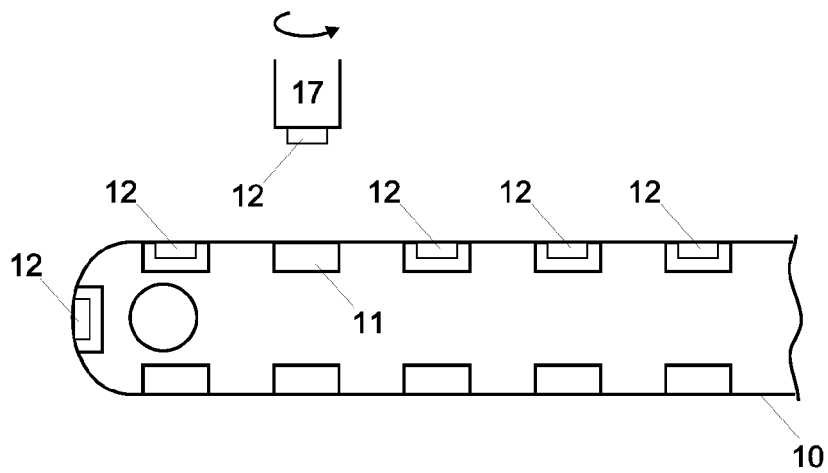
Figure 8:
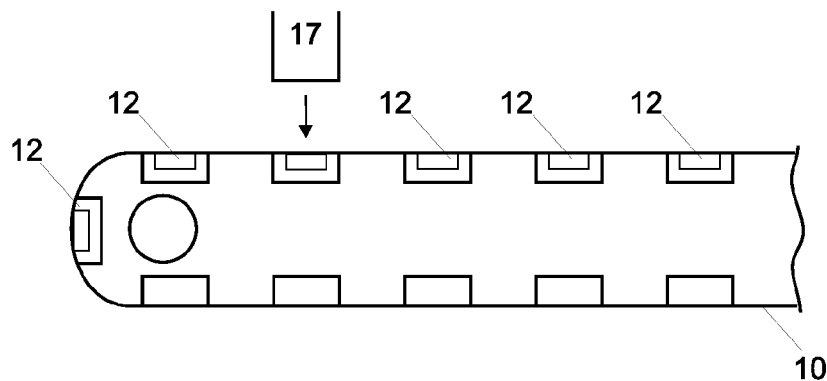
Figure 9:
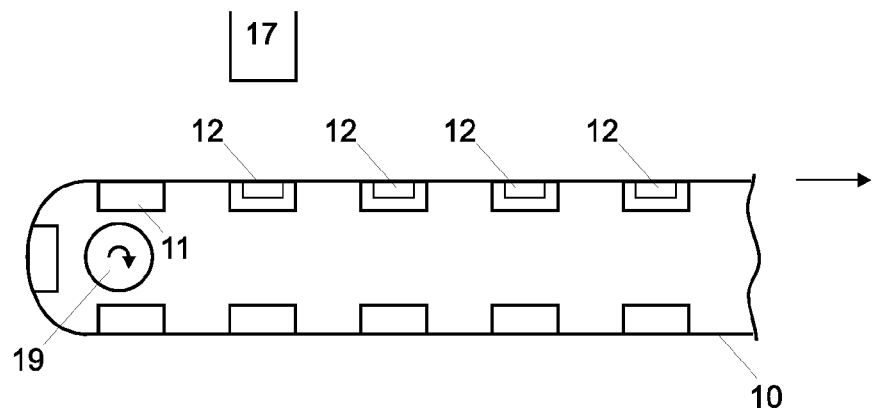
Figure 10:
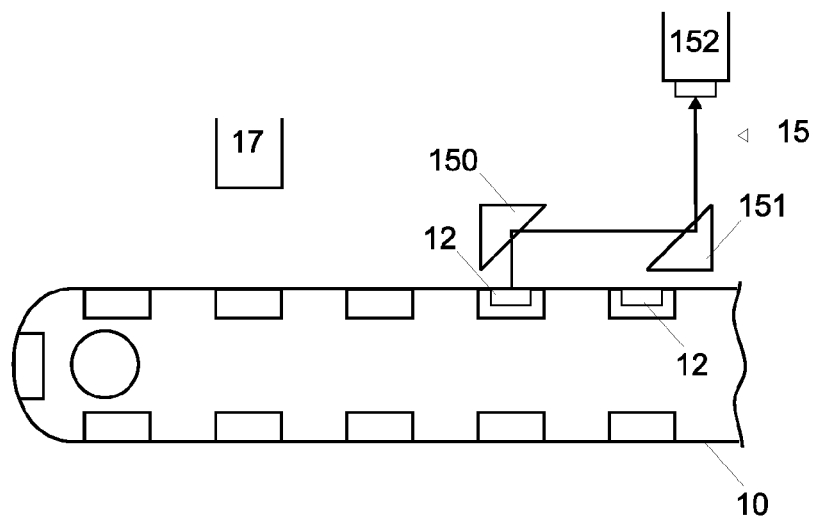

On FIG. 6, the turret 1 is turned backward by half a step and thus returns to its previous angular position of FIG. 3. On FIG. 7, the turret is indexed onward by a full step, in order to present the next electronic component 12 above the empty pocket 11 from which the defective component was removed. Those two steps may be combined. This replacement component is then dropped into this pocket, as illustrated on FIG. 8. The carrier tape 10 is then moved forward on FIG. 9, until the replacement electronic component 12 reaches the inspection station that detected the defective component. Correct insertion of the replacement component is then verified, as illustrated on FIG. 10.

The whole process is then repeated if the inspection station 15 (or another inspection station) detects that the replacement component 12 is also defective. After a predetermined number N of insertions of defective components into the same pocket (N>=1, and typically <10), an alarm is generated and the machine is stopped; repeated problems with the same pocket may be caused by an uneven or dirty pocket.

On the other hand, if the inspection of the replacement components gives a positive result (no defect detected), the filling of the carrier tape with electronic components is continued, until a new defective component 13 is detected.

REFERENCE NUMBERS ON THE FIGURES

1 Turret
2 Processing stations
3 Filling station
10 Carrier tape
11 Pocket
12 Component
13 Bad component
15 Inspection system
150 First prism
151 Second prism
152 Camera
17 Component holder, such as a vacuum nozzle
18 Vacuum system
19 Tension roller

The invention claimed is:

1. A method for filling a carrier tape with electronic components and for removing and replacing defective electronic components from the carrier tape, the method comprising:
    loading an electronic component from one of a plurality of component holders disposed in a turret into a pocket of a carrier tape;
    moving the carrier tape forward;
    automatically detecting that the electronic component in the carrier tape is defective;
    rotating the turret, in response to detecting a defective component, in a first direction to allow an unloading device to be presented above the pocket of the carrier tape;
    moving the carrier tape backward;
    unloading the defective electronic component from the carrier tape using the unloading device;
    rotating the turret in a second direction opposite to the first direction to allow a loading system on the turret to be presented above the pocket of the carrier tape; and
    filling the pocket of the carrier tape with a new electronic component using the loading system.

2. The method of claim 1, wherein the same source of electronic components are used for loading the defective component and said new component.

3. The method of claim 1, wherein said turret is rotated in said first direction and second direction by less than a step when a defective electronic component has been detected.

4. The method claim 1, wherein the defective components are unloaded with a vacuum system independent of the component holder.

5. The method of claim 1, wherein said carrier tape is moved forward after a new component has been loaded.

6. The method of claim 5, wherein said carrier tape is moved forward to its initial position after a new electronic component has been loaded.

7. The method of claim 1, comprising a step of inspecting said new electronic component after it has been loaded into said carrier tape, and removing said new component if it is defective.

8. The method of claim 1, wherein said step of automatically detecting that said electronic component is defective comprises performing a visual inspection of said electronic component.

9. The method of claim 1, wherein said step of automatically detecting that said electronic component is defective comprises performing a mechanical inspection of said electronic component.

10. The method of claim 1, wherein said step of automatically detecting that said electronic component is defective comprises using a first mechanical inspection system for detecting electronic components that protrude out of a pocket, and a second optical system for performing a visual inspection of said electronic component in the pocket.

11. The method of claim 10, wherein the length of the backward movement depends on the inspection station that detected the defective component.

12. The method claim 1, wherein said detection of defective electronic components detects electronic components which are misaligned, flipped, turned or tilted, even if those electronic components are working properly.

13. A device comprising:
a carrier tape comprising a plurality of pockets;
a turret having at least one component holder configured to load an electronic component into one of the plurality of pockets of the carrier tape;
a plurality of component holders disposed in the turret;
a motor coupled with the carrier tape and configured to move the carrier tape backward and forward;
an inspection system to automatically detect that an electronic component located within one of the plurality of pockets of the carrier tape is defective, and in response to detecting that an electronic component located within one of the plurality of pockets of the carrier tape is defective initiates the motor to rotate the turret in a first direction and move the carrier tape backwards if the electronic component is detected as being defective;
an unloading system, to be presented above the pocket of the carrier tape and distinct from the component holder, to remove the defective electronic component from the pocket of the carrier tape; and
a loading system on the turret, to be presented above the pocket of the carrier tape after the turret rotates in a second direction opposite the first direction, to fill the pocket of the carrier tape with a new electronic component.

14. The device of claim 13, further comprising motorized means for replacing said component holder by said unloading system at said filing station.

15. The device of claim 14, said inspection system being a visual inspection system for automatically detecting defective electronic components in said carrier tape.

16. The device of claim 15, said inspection system further comprising a mechanical inspection system for automatically detecting defective electronic components in said carrier tape.

17. A method for filling a carrier tape with electronic components and for removing and replacing defective electronic components from the carrier tape, the method comprising:
loading an electronic component from one or a plurality of component holders disposed in a turret, into a pocket of a carrier tape;
moving the carrier tape forward;
performing a visual inspection of the electronic component in the carrier tape;
automatically detecting that the electronic component in the carrier tape is defective based on the visual inspection;
rotating the turret in a first direction to allow an unloading device to be presented above the pocket of the carrier tape;
moving the carrier tape backward;
unloading the defective electronic component from the carrier tape using the unloading device;
rotating the turret in a second direction opposite to the first direction to allow a loading system on the turret to be presented above the pocket of the carrier tape; and
filling the pocket of the carrier tape with a new electronic component using the loading system.

18. A method comprising
loading an electronic component from one or a plurality of component holders disposed in a turret, into a pocket of a carrier tape; moving the carrier tape forward;
performing a visual inspection of the electronic component in the carrier tape;
automatically detecting that the electronic component in the carrier tape is defective based on the visual inspection;
rotating the turret in a first direction to allow a vacuum system to be presented above the pocket of the carrier tape;
moving the carrier tape backward;
unloading the defective electronic component from the carrier tape using the vacuum system;
rotating the turret in a second direction opposite to the first direction to allow a loading system on the turret to be presented above the pocket of the carrier tape; and
filling the pocket of the carrier tape with a new electronic component using the loading system, wherein the loading system is distinct from the component holder and distinct from the vacuum system.

* * * * *